US010086642B2

(12) United States Patent
Dubach et al.

(10) Patent No.: US 10,086,642 B2
(45) Date of Patent: Oct. 2, 2018

(54) METHOD OF PRODUCING A DECORATED ELEMENT FOR A TIMEPIECE OR PIECE OF JEWELLERY, AND ELEMENT MADE BY THE METHOD

(71) Applicant: The Swatch Group Research and Develoment Ltd, Marin (CH)

(72) Inventors: Alban Dubach, Bienne (CH); Pierry Vuille, Coffrane (CH); Yves Winkler, Schmitten (CH); Stewes Bourban, Chabrey (CH); Jean-Claude Martin, Montmollin (CH)

(73) Assignee: The Swatch Group Research and Development Ltd, Marin (CH)

( * ) Notice: Subject to any disclaimer, the term of this patent is extended or adjusted under 35 U.S.C. 154(b) by 264 days.

(21) Appl. No.: 14/883,695

(22) Filed: Oct. 15, 2015

(65) Prior Publication Data

US 2016/0176228 A1    Jun. 23, 2016

(30) Foreign Application Priority Data

Dec. 19, 2014 (EP) .................................... 14199479

(51) Int. Cl.
*B44C 5/00* (2006.01)
*B22D 25/02* (2006.01)
(Continued)

(52) U.S. Cl.
CPC ............... *B44C 5/00* (2013.01); *B22D 23/06* (2013.01); *B22D 25/026* (2013.01); *B44C 1/18* (2013.01);
(Continued)

(58) Field of Classification Search
CPC ...... B22D 23/06; B22D 25/026; B23K 35/26; B23K 35/268; B44C 1/18; B44C 1/205;
(Continued)

(56) References Cited

U.S. PATENT DOCUMENTS 3,959,527 A * 5/1976 Droege ................. A44C 25/001
148/270
4,583,866 A * 4/1986 Kasai ..................... G04B 19/12
368/232
(Continued)

FOREIGN PATENT DOCUMENTS

CH   707 533 A2    7/2014
EP   2 316 299 A1  5/2011
EP   2 380 864 B1  11/2013

OTHER PUBLICATIONS

European Search Report dated Jul. 27, 2015 in European Application 14199479, filed on Dec. 19, 2014 ( with English Translation).

*Primary Examiner* — John A McPherson
(74) *Attorney, Agent, or Firm* — Oblon, McClelland, Maier & Neustadt, L.L.P.

(57) ABSTRACT

The method makes it possible to produce a decorated element for a timepiece or piece of jewelry. This decorated element may be, for example, a watch dial. The method includes the steps of taking a base substrate, and micromachining on said base substrate a mold or decorative partitions in a programmed pattern, and filling the mold or the decorative partitions with at least one filler material to obtain the decorated element. The filler material may be an epoxy resin and the mold or the partitions are obtained by melting and solidifying a solder paste or powder.

13 Claims, 2 Drawing Sheets

(51) Int. Cl.

| | |
|---|---|
| *B22D 23/06* | (2006.01) |
| *B44C 1/18* | (2006.01) |
| *G03F 7/00* | (2006.01) |
| *G03F 7/20* | (2006.01) |
| *B44C 1/20* | (2006.01) |
| *G04B 5/16* | (2006.01) |
| *G04B 19/04* | (2006.01) |
| *G04B 19/12* | (2006.01) |
| *G04B 45/00* | (2006.01) |
| *G04B 45/04* | (2006.01) |

(52) U.S. Cl.
 CPC ............ *B44C 1/205* (2013.01); *G03F 7/0017* (2013.01); *G03F 7/2002* (2013.01); *G04B 5/16* (2013.01); *G04B 19/042* (2013.01); *G04B 19/12* (2013.01); *G04B 45/00* (2013.01); *G04B 45/046* (2013.01)

(58) Field of Classification Search
 CPC ........... B44C 3/04; B44C 3/044; B44C 3/046; B44C 5/00; G04B 19/042; G04B 19/12; G04B 45/00; G04B 45/046; G04B 5/16; G03F 7/0017; G03F 7/0037; G03F 7/20; G03F 7/2002
 USPC ......................................... 430/295, 198, 320
 See application file for complete search history.

(56) References Cited

U.S. PATENT DOCUMENTS

| | | |
|---|---|---|
| 2007/0227893 A1 | 10/2007 | Saucy |
| 2011/0062112 A1 | 3/2011 | Saucy |
| 2011/0203934 A1 | 8/2011 | Rey-Mermet |
| 2011/0303546 A1 | 12/2011 | Saucy |
| 2014/0356638 A1* | 12/2014 | Wang ..................... C23C 14/35 428/446 |

* cited by examiner

METHOD OF PRODUCING A DECORATED ELEMENT FOR A TIMEPIECE OR PIECE OF JEWELLERY, AND ELEMENT MADE BY THE METHOD

This application claims priority from European Patent Application No. 14199479.8 filed on Dec. 19, 2014, the entire disclosure of which is hereby incorporated herein by reference.

FIELD OF THE INVENTION

The invention concerns a method of producing at least one decorated element for a timepiece or piece of jewellery.

The invention also concerns a decorated element obtained according to the production method.

BACKGROUND OF THE INVENTION

In order to decorate an element or component of a timepiece or piece of jewellery, enamelling may be performed on a surface of the component after creating a set of cells or partitions on the component. This may be hot enamelling. This conventional technique known as "cloisonné" is one of numerous enamelling techniques, which include amongst others: "grisaille", dry applique, painting on enamel, "champlevé", "basse-taille", "plique-à-jour", relief enamelling, "paillonné", to name the main techniques.

The principle of this traditional decorative technique consists in manually creating a design formed of metal wire partition walls, then filling the partitions with successive layers of transparent or opaque enamels on a metal or ceramic support. The raw materials of the vitreous substance known as enamel are mainly silica, in the form of very pure sand, feldspars, pegmatites, chalk, lime and sometimes kaolin, associated with metal compounds to give the enamel its colour. This substance deposited on a surface of a component is fired until it fuses and adheres to the metal or ceramic component. The process of creating the decoration by various manual steps is long and cannot be reproduced in an identical manner from one component to the next, which is a drawback.

In the case of the "cloisonné" or partitioned technique, there is generally a significant number of steps required to create the decorated element. This requires drawing the design directly on paper or on a computer before creating the decorative patterns by hand, notably with a metal wire placed on the drawing as a base. The reproduction of the drawing on a metal or ceramic or ceramo-metallic support is generally achieved by hand engraving, machine engraving or freehand engraving. The support can then be enamelled with an enamel layer which may or may not be transparent. The patterns of the decoration are then placed on the support and secured to form the cells or partition walls, which are made level. A filler material, such as enamel, is subsequently inserted in the partitions and normally the enamelled support must also be fired. A polishing operation may also be provided when the enamelled component is removed from the furnace. Since this method of producing a decorated element requires a very large number of steps, this constitutes a drawback for making such a decorated element.

Reference may be made in this regard to EP Patent No. 2 380 864 B1, which describes a method for manufacturing a ceramic element, which is inlaid with at least one metallic decoration. First of all an etch is made in the ceramic material by means of a laser beam to obtain one or more hollows. Next, in each hollow, a metal layer is deposited by vapour phase deposition and autocatalysis to form the adhesion layer. Thereafter, a decorative layer is electroplated on the adhesion layer to finalise the decoration of the element. It is complicated to fill each hollow made in the ceramic material with the metallic layers to form the decorated element, which is a drawback. Further, decoration exclusively by vapour phase deposition of a metallic layer cannot produce decorative layers of sufficient thickness.

CH Patent Application No. 707 533 A2 describes a method for manufacturing a watch dial decorated with embroidery. First of all, a decal etch is made in a cloth canvas or embroidery. Once the overlay or copy sheet is pierced with the desired design, a powder is spread over the overlay. The design is then printed on the canvas to highlight the design for the embroidery operation, which follows this printing step. Once the embroidery is finished, the decorated canvas is bonded to a support, such as a watch dial. This method also includes a very large number of steps for decorating the watch dial, which is a drawback. Further, it is not possible to create a decoration of complex shape with this method and the bonding of the decoration is generally not reliable in the long-term.

US Patent Application Nos 2011/0203934 A1 and 2011/0303546 A1 describe a method for fabricating metal microstructures. To obtain such metal microstructures, a heterogeneous LIGA method is used. First of all, a metal adhesion layer must be deposited on a base substrate, and a photosensitive resin layer is structured by photolithography. A metal design is then produced, in the portions removed from the resin layer, by galvanic growth on the metal adhesion layer. Finally, the resin layer is removed, as is the base substrate, to obtain said metal microstructure. Since the metal microstructure is obtained by a LIGA method with galvanic growth, this means it is impossible to produce a decorated element rapidly and easily, which is a drawback.

EP Patent Application No. 2 316 299 A1 describes a timepiece or piece of jewellery and the method of fabricating the same. The piece includes a metal base structure, which is provided with a relief decoration, and with an elastomer layer deposited on a surface of the structure by means of an adhesion layer. The decorative design is obtained by milling or chemical etching or laser or stamping, but it cannot rapidly and easily provide a precise decoration of complex shape, which is a drawback.

SUMMARY OF THE INVENTION

It is therefore an object of the invention to propose a method for producing a decorated element for a timepiece or piece of jewellery that overcomes the drawbacks of the aforementioned prior art to facilitate the manufacture of such a decorated element, and the reproducibility thereof.

To this end, the invention concerns a method for producing a decorated element for a timepiece or piece of jewellery, wherein the method includes the steps of:
  taking a base substrate,
  depositing a layer of positive or negative photosensitive resin on the base substrate,
  placing a contour mask of the pattern to be created on the photosensitive resin,
  illuminating the resin through the mask,
  removing the illuminated portions of the resin, if the photosensitive resin is of the positive type, or removing the non-illuminated portions of the resin, if the photosensitive resin is of the negative type,
  filling the removed portions of the resin with at least one solder paste or powder to produce partitions or a mould, heating the assembly formed of the base substrate, the resin and the solder paste or powder to melt the solder paste or powder prior to solidification of the solder, removing all the resin, and filling the mould or decorative partitions with at least one filler material to obtain the decorated element, To this end, the invention further concerns a method for producing a decorated element for a timepiece or piece of jewellery, wherein the method includes the steps of:

taking a base substrate, depositing a layer of positive or negative photosensitive resin on the base substrate, placing a contour mask of the pattern to be created on the photosensitive resin, illuminating the resin through the mask, removing the illuminated portions of the resin, if the photosensitive resin is of the positive type, or removing the non-illuminated portions of the resin, if the photosensitive resin is of the negative type, depositing in the removed portions of the resin, one or more metal layers by physical vapour deposition or chemical vapour deposition, removing all the resin, depositing at least one solder paste or powder on the metal layer or layers, melting the solder paste or powder to obtain a solder liquid, which only wets the metal layer or layers, and solidifying the liquid solder to form partitions or a mould in the desired pattern, and filling the mould or decorative partitions with at least one filler material to obtain the decorated element.

To this end, the invention further concerns a method for producing a decorated element for a timepiece or piece of jewellery, wherein the method includes the steps of:

taking a base substrate, depositing a layer of positive or negative photosensitive resin on the base substrate, placing a contour mask of the pattern to be created on the photosensitive resin, illuminating the resin through the mask, removing the illuminated portions of the resin, if the photosensitive resin is of the positive type, or removing the non-illuminated portions of the resin, if the photosensitive resin is of the negative type, depositing in the removed portions of the resin, one or more non-conductive layers by physical vapour deposition or chemical vapour deposition to define a complementary pattern for the creation of partitions or a mould, removing all the resin, depositing at least one solder paste or powder in the removed portions of the non-conductive layer or layers, melting and solidifying the solder paste or powder to form the partitions or the mould, and filling the mould or decorative partitions with at least one filler material to obtain the decorated element.

Particular steps of the method for producing a decorated element are defined in the dependent claims attached hereto.

One advantage of the method for producing a decorated element lies in the fact that it is easily possible to produce two-dimensional or three-dimensional decorations with complex shapes in a limited number of production steps. The decorations can be made directly on a metal, ceramic or ceramo-metallic object, such as cermet and in on an industrial scale. To improve adherence to the decoration, the base substrate may be treated with a metallic or ceramic or cermet layer from the same family as the materials of the decoration. The decorations are pre-drawn or pre-programmed on a computer, which makes it possible to create very fine and reproducible decorations.

One advantage of the method for producing the decorated element lies in the fact that partitions or a mould can be obtained on a base substrate by depositing a solder paste or powder in open resin portions on the substrate and in the pattern of the drawn decoration. The solder paste or powder can be either deposited directly on the surface of the base substrate, which may be metal or ceramic, or on a conductive layer formed on the surface of the base substrate. The solder paste or powder is inserted in the open resin portions and subsequently heated and melted before the solder hardens. Any metallic composition can be used for the solder, taking account of the colour of the metal components of the watch on which the decorated element may be placed. Finally, the resin can easily be removed by chemical etching, and the partitions, obtained by a low temperature solder, are filled with a filler material for the decoration.

Advantageously, the filler material may be a cold enamel, defined as an imitation enamel. For this cold enamelling technique, an epoxy resin is used, which is a thermo hardening polymer containing colour pigments. Once inserted in the partitions, the epoxy resin is dried. For the filler material, it is possible to use ceramic or ceramo-metallic powders with a lower fusion point than that of the material used to form the partitions.

To this end, the invention also concerns a decorated element obtained according to the method for producing the decorated element, wherein the element includes a filler material held to walls of a mould or decorative partitions micromachined in a programmed pattern.

Specific embodiments of the decorated element are defined in the dependent claims attached hereto.

BRIEF DESCRIPTION OF THE DRAWINGS

The objects, advantages and features of the method for producing a decorated element for a timepiece or piece of jewellery and the decorated element obtained will appear more clearly in the following description with reference to the drawings, in which.

DETAILED DESCRIPTION OF THE INVENTION

In the following description, any techniques for producing decorative patterns for a watch or jewellery element that are well known in the state of the art will be referred to only in a simplified manner. The decorative patterns concern partitions or a mould deposited on a base substrate by techniques defined as micro-machining techniques.

Preferably, the invention particularly concerns the application of mass production processes to certain steps of the "cloisonné" and "plique-à-jour" techniques. With these two techniques, it is possible, for example, to enamel a volume pattern by first creating partitions with metal wires or strips. These partitions are preferably placed on a base substrate, which may be metal or ceramic or ceramo-metallic, such as cermet, or another material indicated below.

The method for producing a decorated element for a watch or piece of jewellery includes a first essential step of creating partitions or walls or a mould on this base substrate by a micro-machining technique. The base substrate may be a crystalline or amorphous metal material, a ceramic, a semiconductor, a cermet, or any other material. As regards the ceramic, this concerns alumina, zirconia, magnesium oxide, boron nitride, silicon nitride, silicon carbide, aluminium titanate and aluminium nitride, or other types of ceramic. It is also possible to have base substrate made of quartz, glass, sapphire, corundum or another type of precious stone. The material of the mould or the partitions may be the same as that of the base substrate.

The decorative patterns defined by the partitions are first drawn or programmed in a computer, and the stored drawing or pattern data is transmitted to the micromachining machine in order to produce said partitions. Thereafter, an operation is also performed to fill the partitions with a filler material, which may preferably be a cold enamel, which is a thermo hardening polymer containing colour pigments, a metal alloy, or even a ceramic or a cermet. The enamel may be deposited or placed unfired in the partitions and is defined as an imitation enamel.

FIGS. 1a to 1g schematically show all the steps necessary to produce the decoration on a base substrate 2 in order to obtain a decorated element for a timepiece or piece of jewellery. To achieve this, there is first of all taken a base substrate 2, which may be metal, ceramic or ceramo-metallic. It is also possible to envisage having a semiconductor base substrate, such as silicon, or gallium arsenide.

Figure 1A:
FIGS. 1a to 1g show the different steps for producing a decorated element for a watch component or piece of jewellery according to the invention.

In the first step shown in FIG. 1a, at least one conductive layer 3 is deposited on the surface of the base substrate 2. This conductive layer 3 may be a thin metal layer deposited by a PVD or CVD technique or by cathodic sputtering. It is even possible to deposit several successive conductive layers 3 of the same material or of a different material from one layer to the next. However, this first step may be avoided, if the base substrate 2 is metal, typically made of copper, or if an active solder is used as explained below.

Figure 1B:
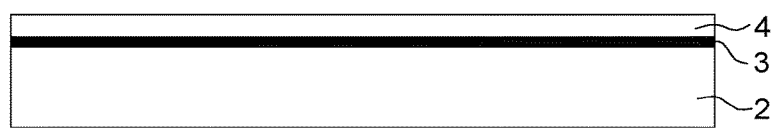

In the second step shown in FIG. 1b, a photosensitive resin 4 is deposited on the surface of base substrate 2, or on conductive layer 3. This photosensitive resin 4 may be a polyimide PMMA (polymethyl methacrylate) based resin or an octafunctional epoxidized novalac resin available from Shell Chemical under the reference SU-8 and a photoinitiator chosen from among triarylsulfonium salts. This photosensitive resin 4 may be photopolymerized by ultraviolet (UV) radiation.

Figure 1C:
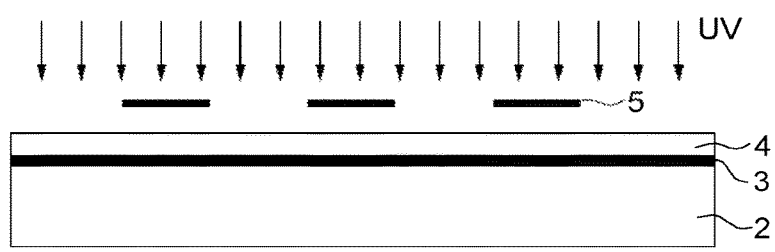
Figure 1D:
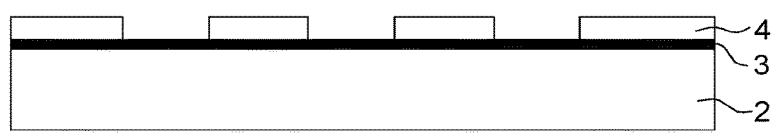

In the third step shown in FIG. 1c, a contour mask 5 of pattern to be made on base substrate 2 of the element is arranged on resin 4. Mask 5 may be a glass plate on which a masking layer is formed with opaque and transparent portions according to the pattern to be made. Light radiation, for example of the UV type, is directed onto mask 5 to irradiate the unmasked portions of resin 4. When using this type of resin 4, which is a negative photosensitive resin, the non-irradiated portions can be removed by physical or chemical means in the fourth step shown in FIG. 1d. This makes it possible to define the shapes of the partitions or mould in the removed portions 4a of resin 4.

It is to be noted that a positive photosensitive resin 4 may also be used, with a mask 5 having a masking layer with opaque and transparent portions according to the pattern to be made. This mask is the reverse of the mask used with negative resin 4. In such case, it is the irradiated portions of the resin which are removed in the fourth step.

Figure 1E:
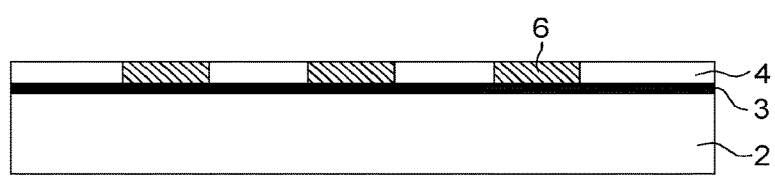

In the fifth step shown in FIG. 1e, the open portions 4a of resin 4 on base substrate 2 or on conductive layer 3, are filled with a solder paste or powder 6. The solder paste or powder 6 is generally formed of a metal or a metal alloy, which preferably has a lower melting point than that of the photosensitive resin, namely below 380° C. Solder paste 6 is generally formed of a powder with an additive or organic binder. The metal powder used may be, for example, a mixture of gold and tin (Au—Sn) or there may be a mixture of two powders, which consist of gold and tin for the first powder and gold for the second powder. The low temperature solder paste or powder may also be formed of eutectic Au—Si compositions with a melting point around 363° C., Au—Ge with a melting point around 361° C., Au—Sb with a melting point around 360° C. or Au—Ga alloys with a melting point around 340° C. and Au—Ga—In alloys with a melting point around 325° C. Further, other types of solder compositions containing no precious elements and comprising Sn, Sn—Pb or In may be used with a melting point around 380° C.

It is also possible to envisage using a solder paste or powder 6, which is formed of a mixture of metal powder and ceramic particles. The metal powder is the part of the mixture that can easily melt and also bind the ceramic particles. This type of mixture has the advantage of increasing the hardness of the partitions produced while providing a composite appearance.

In the sixth step also shown in FIG. 1e, the assembly, which is notably formed of base substrate 2, resin 4 and solder paste or powder 6 inserted in the open portions 4a of resin 4, is heated to melt the solder paste or powder 6 in the partitions. Afterwards, the solder paste or powder solidifies. The capillary effect of the solder liquid in the partitions results in good adhesion of said low temperature solder and completely fills all the spaces in the partitions. In the case of the metal solder paste, the organic additive or additives are burnt off or evaporated.

Figure 1F:
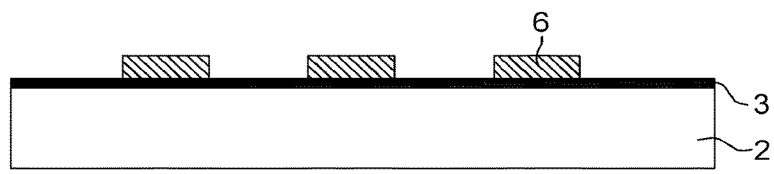
Figure 2:
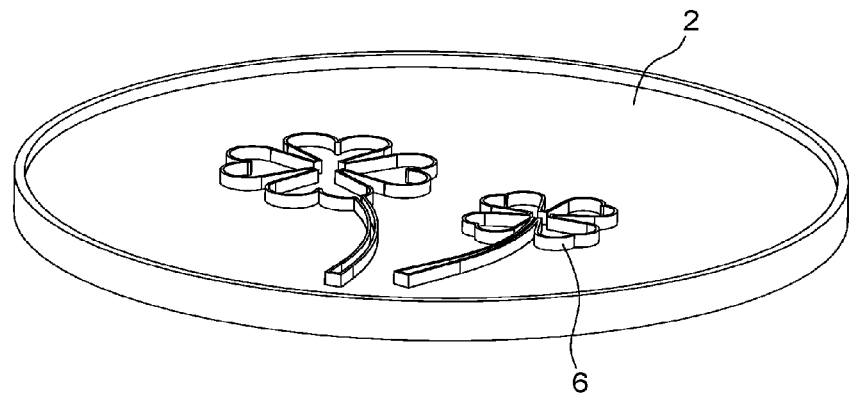
FIG. 2 shows an element of a watch component or piece of jewellery with partitions or walls made according to the invention.

In the seventh step shown in FIG. 1f, all of photosensitive resin 4 is removed. After this resin removal step, there is obtained an element comprising metal partitions 6. This element is represented, for example, in the form of a watch dial in a three dimensional view with its pattern in FIG. 2.

Figure 1G:
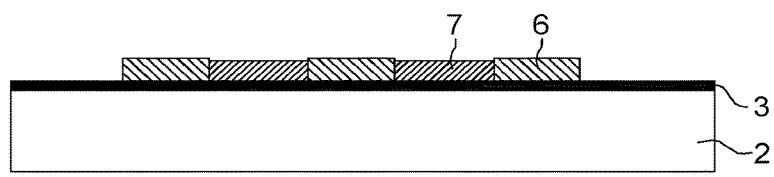

In the eighth step shown in FIG. 1g, the spaces between the partitions 6 are filled with a filler material 7, which may preferably be a cold enamel or imitation enamel, such as an epoxy resin with colour pigments. Different colours of filler material 7 may be selected to fill partitions 6, in order to create a decorated element. This imitation enamel is dried and solidified to thus form a decorated element 1 at the end of the production method.

Figure 3:
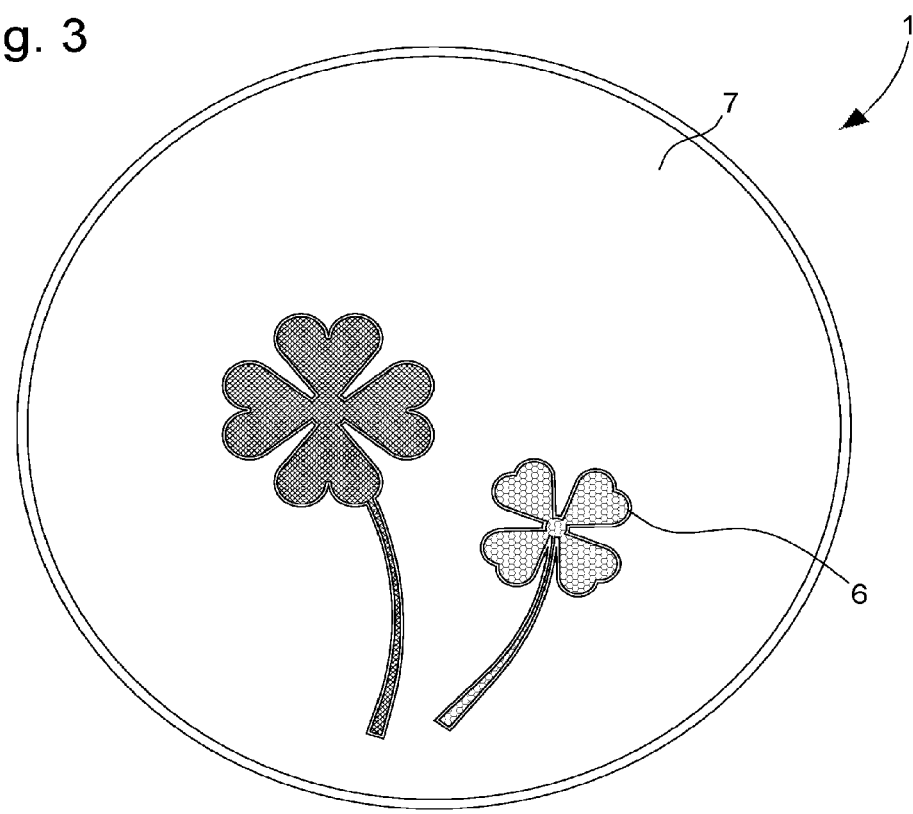
FIG. 3 shows an element for a watch component or piece of jewellery after the steps of filling and hardening the filler material according to the invention.

Another type of filler material 7, such as a metal or metal alloy, may be inserted in the form of a paste or liquid in the spaces between the partitions and then solidified. It may be envisaged to use ceramic or cermet as the filler material, which is disposed between the partitions in the form of a powder or liquid before a solidification operation. Once finished, decorated element 1 may take the form of a watch dial as shown in a top view in FIG. 3.

Of course, after the eighth step, it is also possible to remove base substrate 2, which is, for example, metal or ceramic or ceramo-metallic, or even made of semiconductor material, by a machining or selective dissolution operation. In such case, the decorated element 1 obtained thus includes portions of enamel made of epoxy resin 7 surrounded by the design structure 6.

It is also to be noted that base substrate 2 can also be hollowed out, particularly by laser beam, to improve the mechanical adhesion of filler material 7 between the partitions. Micro holes or hollows could also be made in the partitions to ensure the proper adhesion of filler material 7. These operations are performed before the solder paste or powder is inserted in the open portions of the resin. Different thicknesses of filler material 7 may be envisaged to obtain a two-dimensional or three-dimensional decorative pattern.

In a variant embodiment, in the fifth step of the method, it may be envisaged to deposit one or more PVD or galvanic metal layers in the open portions 4a of resin 4. This resin may subsequently be removed and a solder paste or powder 6 is deposited on the PVD or galvanic conductive layer or layers deposited on base substrate 2. Solder paste or powder 6 is melted on the conductive layers in the pattern of the decoration. Since the solder liquid only wets the metallized areas and not base substrate 2, which, in this case, is ceramic, the partitions are created after the solder paste or powder solidifies in the desired pattern and in a suitable thickness. Thereafter, filler material 7 is inserted into the partitions and the same operations as mentioned above are performed to produce decorated element 1.

It is to be noted that, in the aforementioned variant embodiment, the solder paste or powder no longer needs to have a low melting point, given that the resin has been removed. The melting point of the solder must, however, be lower than the melting point of the base substrate on which it is deposited before heating.

Of course, for this variant embodiment, it may also be envisaged to have a metal base substrate, but in that case, it is necessary to deposit at least one non-metallic layer by PVD or CVD, such as an oxide or nitride around the decorative pattern, where the metal solder paste or powder will be deposited. Other conductive layers are not deposited by PVD or CVD, since the base substrate is metal. To achieve this, after deposition of the photosensitive resin on the base substrate, the resin is irradiated by a UV beam through a mask of the pattern to be created. The non-irradiated portions of the resin are, for example, removed, in order to deposit the non-metallic layer or layers and define a complementary pattern for producing the partitions or mould. Once the non-metallic layer or layers have been deposited, all the resin can be removed. Immediately thereafter, the solder paste or powder is deposited in the removed portions of the non-conductive layer or layers. The solder is melted and solidified to form the partitions or the mould. Finally, the filler material can fill the spaces between the partitions to obtain the decorated element.

From the description that has just been given, several variants of the method for producing a decorated element for a timepiece or piece of jewellery can be devised by those skilled in the art without departing from the scope of the invention defined by the claims. The decorated element may also be a watch hand, or a date disc, or another component of the watch, such as a seconds wheel, and oscillating weight, or a back cover of a watch case.

What is claimed is:

1. A method for producing a decorated element for a timepiece or piece of jewellery, wherein the method comprises:
   taking a base substrate,
   depositing a layer of positive or negative photosensitive resin on the base substrate,
   placing a contour mask of the pattern to be created on the photosensitive resin,
   illuminating the resin through the mask,
   removing the illuminated portions of the resin, when the photosensitive resin is of the positive type, or removing the non-illuminated portions of the resin, when the photosensitive resin is of the negative type,
   filling the removed portions of the resin with at least one solder paste or powder to produce partitions or a mould,
   heating the assembly formed of the base substrate, the resin and the solder paste or powder to melt the solder paste or powder prior to solidification of the solder,
   removing all the resin, and
   filling the mould or decorative partitions with at least one filler material to obtain the decorated element.

2. The method for producing a decorated element according to claim 1, wherein at least one conductive layer, which includes a metal layer, is deposited by a physical vapour deposition or chemical vapour deposition or by cathodic sputtering on the surface of the base substrate before the resin layer is deposited.

3. The method for producing a decorated element according to claim 1, wherein the solder paste or powder used is metal solder paste or powder.

4. The method for producing a decorated element according to claim 3, wherein the solder paste or powder used is low temperature solder paste or powder below 380° C.

5. The method for producing a decorated element according to claim 4, wherein the metal powder or powders are formed of a mixture of gold and tin, or a mixture of gold and tin in a first powder and gold in a second powder.

6. The method for producing a decorated element according to claim 1, wherein the solder paste or powder is formed of eutectic compositions of Au—Si or Au—Ge or Au—Sb or Au—Ga or Au—Ga—In alloys.

7. The method for producing a decorated element according to claim 1, wherein the solder paste or powder used includes a mixture of metal powder and ceramic particles.

8. The method for producing a decorated element according to claim 1, wherein the solder paste is formed of at least one metal powder with at least one organic additive or binder.

9. The method for producing a decorated element according to claim 1, wherein once the mould or decorative partitions are filled with the solidified filler material held to walls of said mould or of said partitions, a machining or selective dissolution operation is performed to remove the base substrate, which is metal or ceramic or ceramo-metallic or made of semiconductor material.

10. The method for producing a decorated element according to claim 1, wherein the base substrate is hollowed at the surface to improve the mechanical adherence of the filler material to the hollowed surface of the substrate between the partitions.

11. The method for producing a decorated element according to claim 1, wherein micro holes or hollows are made in the partitions or the mould to improve the mechanical adherence of the filler material.

12. A method for producing a decorated element for a timepiece or piece of jewellery, wherein the method comprises:
   taking a base substrate,
   depositing a layer of positive or negative photosensitive resin on the base substrate,
   placing a contour mask of the pattern to be created on the photosensitive resin,
   illuminating the resin through the mask,
   removing the illuminated portions of the resin, when the photosensitive resin is of the positive type, or removing the non-illuminated portions of the resin, when the photosensitive resin is of the negative type, depositing in the removed portions of the resin, one or more metal layers by physical vapour deposition or chemical vapour deposition, removing all the resin, depositing at least one solder paste or powder on the metal layer or layers, melting the solder paste or powder to obtain a solder liquid, which only wets the metal layer or layers, and solidifying the liquid solder to form partitions or a mould in the desired pattern, and filling the mould or decorative partitions with at least one filler material to obtain the decorated element.

13. A method for producing a decorated element for a timepiece or piece of jewellery, wherein the method comprises:

taking a base substrate, depositing a layer of positive or negative photosensitive resin on the base substrate, placing a contour mask of the pattern to be created on the photosensitive resin, illuminating the resin through the mask, removing the illuminated portions of the resin, when the photosensitive resin is of the positive type, or removing the non-illuminated portions of the resin, when the photosensitive resin is of the negative type, depositing in the removed portions of the resin, one or more non-conductive layers by physical vapour deposition or chemical vapour deposition to define a complementary pattern for the creation of partitions or a mould, removing all the resin, depositing at least one solder paste or powder in the removed portions of the non-conductive layer or layers, melting and solidifying the solder paste or powder to form the partitions or the mould, and filling the mould or decorative partitions with at least one filler material to obtain the decorated element.

* * * * *